United States Patent
North et al.

(10) Patent No.: US 11,161,624 B2
(45) Date of Patent: Nov. 2, 2021

(54) AIRCRAFT COMPONENT MONITORING SYSTEM

(71) Applicant: GE Aviation Systems Limited, Cheltenham (GB)

(72) Inventors: Timothy Robert North, Southampton (GB); Steven Bonnett, Southampton (GB); Tod Alexander Gilbert, Marlborough (GB)

(73) Assignee: GE AVIATION SYSTEMS LIMITED, Cheltenham (GB)

( * ) Notice: Subject to any disclaimer, the term of this patent is extended or adjusted under 35 U.S.C. 154(b) by 796 days.

(21) Appl. No.: 15/598,595

(22) Filed: May 18, 2017

(65) Prior Publication Data

US 2017/0341773 A1 Nov. 30, 2017

(30) Foreign Application Priority Data

May 25, 2016 (GB) ...................... 1609154

(51) Int. Cl.
*B64D 45/00* (2006.01)
*G06F 30/20* (2020.01)
*G01M 17/00* (2006.01)

(52) U.S. Cl.
CPC ......... *B64D 45/0005* (2013.01); *G01M 17/00* (2013.01); *G06F 30/20* (2020.01); *B64D 2045/0085* (2013.01)

(58) Field of Classification Search
CPC ................................................ B64D 45/0005
See application file for complete search history.

(56) References Cited

U.S. PATENT DOCUMENTS 8,036,783 B2 10/2011 Pohl
8,924,171 B2 12/2014 Moreau et al.
(Continued)

FOREIGN PATENT DOCUMENTS

EP 0 980 001 A1 2/2000
EP 2 523 009 A1 11/2012
(Continued)

OTHER PUBLICATIONS

Machine Translation and Notification of Reasons for Refusal issued in connection with corresponding JP Application No. 2017-100487 dated May 8, 2018.
(Continued)

*Primary Examiner* — John E Breene
*Assistant Examiner* — Jeffrey C Morgan
(74) *Attorney, Agent, or Firm* — Dority & Manning, P.A.

(57) ABSTRACT

Systems and methods for determining aircraft component phase position are provided. In one embodiment, a method can include receiving a set of data from a data acquisition system associated with a component. The method can include identifying a plurality of phase reference points based, at least in part, on the set of data. Each phase reference point can be indicative of a phase position of the component relative to the data acquisition system at a respective point in time. The method can include generating a model based, at least in part, on the plurality of phase reference points. The model can be indicative of the phase position of the component relative to the data acquisition system at a plurality of times. The method can include determining the phase position of the component at one or more points in time based, at least in part, on the model.

15 Claims, 6 Drawing Sheets

(56) References Cited

U.S. PATENT DOCUMENTS

| | | | |
|---|---|---|---|
| 9,020,689 | B2 | 4/2015 | Smith et al. |
| 9,233,763 | B1 | 1/2016 | Chen |
| 2008/0033695 | A1* | 2/2008 | Sahara .................. G01H 1/003 |
| | | | 702/185 |
| 2009/0043447 | A1 | 2/2009 | Vershinin et al. |
| 2012/0229290 | A1 | 9/2012 | Gerez et al. |
| 2012/0330604 | A1 | 12/2012 | Whitefield, II |

FOREIGN PATENT DOCUMENTS

| | | |
|---|---|---|
| JP | H09-113416 A | 5/1997 |
| JP | 2006-113002 A | 4/2006 |
| JP | 2009-020090 A | 1/2009 |
| JP | 2014-092542 A | 5/2014 |

OTHER PUBLICATIONS

Coats, M.D. et al., "Extraction of tacho information from a vibration signal for improved synchronous averaging," Proceedings of Acoustics 2009, Australian Acoustical Society, pp. 1-8, (Nov. 23-25, 2009).

Combined Search and Examination Report issued in connection with corresponding GB Application No. 1609154.8 dated Nov. 22, 2016.

* cited by examiner

AIRCRAFT COMPONENT MONITORING SYSTEM

FIELD OF THE INVENTION

The present subject matter relates generally to monitoring aircraft components and more particularly to determining the phase position of an aircraft component.

BACKGROUND

For individual machinery control and operation, aircrafts often include sensors fitted to the aircraft machinery. These sensors typically provide information about the machinery. For example, the sensors may provide information regarding the health, status, condition, and/or position of the machinery as it operates. However, such information can be limited to only a single fixed location associated with the machinery. This can introduce difficulty into the analysis of the health and condition of the machinery, particularly for rotating machinery that experiences a change in rotation speed over time. As such, the analysis of the machinery can be limited, for example, to asynchronous analytical techniques.

BRIEF DESCRIPTION

Aspects and advantages of examples of the present disclosure will be set forth in part in the following description, or may be learned from the description, or may be learned through practice of the examples.

One example aspect of the present disclosure is directed to a computer-implemented method of determining component phase position in a mechanical system. The method can include receiving, by one or more computing devices, a first set of data from a data acquisition system associated with a component. The first set of data can be indicative of a signal detected by the data acquisition system. The method can further include identifying, by the one or more computing devices, a plurality of phase reference points based at least in part on the first set of data. Each phase reference point can be indicative of a phase position of the component relative to the data acquisition system at a respective point in time. The method can include generating, by the one or more computing devices, a model based at least in part on the plurality of phase reference points. The model can be indicative of the phase position of the component relative to the data acquisition system at a plurality of times. The method can further include determining, by the one or more computing devices, the phase position of the component at one or more points in time based at least in part on the model.

Another example aspect of the present disclosure is directed to a computing system for determining component phase position. The computing system can include one or more processors and one or more memory devices. The one or more memory devices can store instructions that when executed by the one or more processors cause the one or more processors to perform operations. The operations can include receiving a first set of data from a data acquisition system associated with a component. The first set of data can be indicative of a signal detected by the data acquisition system. The operations can further include identifying a plurality of phase reference points based at least in part on the first set of data. Each phase reference point can be indicative of a phase position of the component relative to the data acquisition system at a respective point in time. The operations can include determining the phase position of the component at one or more points in time based at least in part on the plurality of phase reference points.

Yet another example aspect of the present disclosure is directed to an aircraft. The aircraft can include a component with a variable rotation speed, a data acquisition system associated with the component, and a computing system with one or more processors and one or more memory devices. The one or more memory devices can store instructions that when executed by the one or more processors cause the one or more processors to perform operations. The operations can include receiving a first set of data from the data acquisition system. The first set of data can be indicative of a signal associated with the component detected by the data acquisition system. The operations can further include identifying a plurality of pulses of the signal based on the first set of data. The operations can include determining a threshold based at least in part on the pulses. The operations can further include identifying one or more of the plurality of pulses that are above the threshold. The pulses that are above the threshold can be associated with the component. The operations can include identifying a phase reference point for each of the one or more pulses associated with the component based at least in part on the first set of data. Each phase reference point can be indicative of a phase position of the component relative to the data acquisition system at a respective point in time. The operations can include determining the phase position of the component at one or more points in time based at least in part on the plurality of phase reference points.

Other example aspects of the present disclosure are directed to systems, methods, aircrafts, avionics systems, devices, non-transitory computer-readable media for determining component phase position.

Variations and modifications can be made to these example aspects of the present disclosure.

These and other features, aspects and advantages of various examples will become better understood with reference to the following description and appended claims. The accompanying drawings, which are incorporated in and constitute a part of this specification, illustrate examples of the present disclosure and, together with the description, serve to explain the related principles.

BRIEF DESCRIPTION OF THE DRAWINGS

Detailed discussion of examples directed to one of ordinary skill in the art are set forth in the specification, which makes reference to the appended figures, in which.

DETAILED DESCRIPTION

Figure 1:
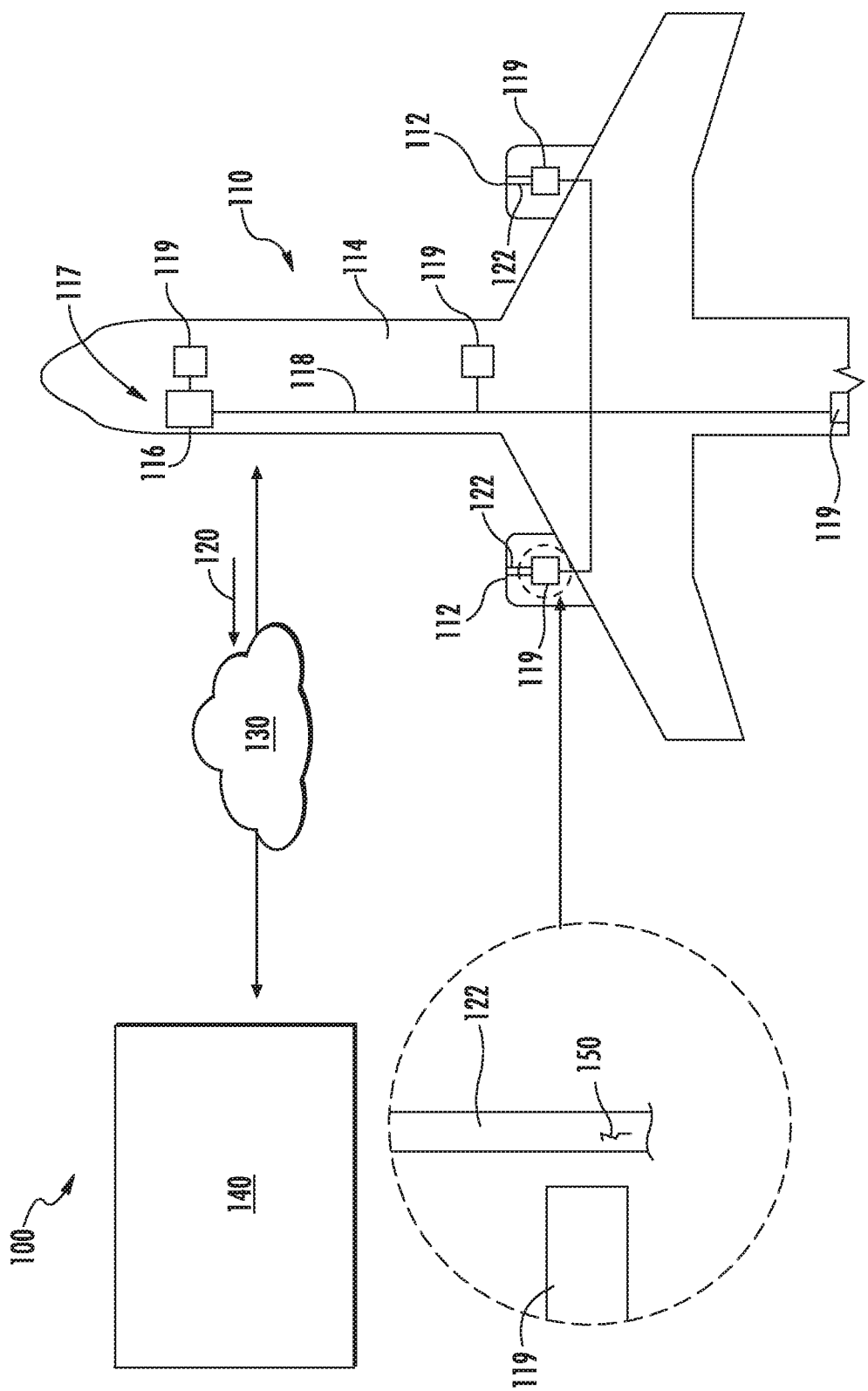
FIG. 1 depicts an example system according to example of the present disclosure.

Reference now will be made in detail to embodiments of the present disclosure, one or more example(s) of which are illustrated in the drawings. Each example is provided by way of explanation of the present disclosure, not limitation of the present disclosure. In fact, it will be apparent to those skilled in the art that various modifications and variations can be made in the present disclosure without departing from the scope of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

Example aspects of the present disclosure are directed to systems and methods of determining component phase position in a mechanical system, such as, for example, an aircraft. For instance, an aircraft can include a computing system in communication with one or more data acquisition system(s). The data acquisition system(s) can include, for example, a tachometer associated with a component of an aircraft engine. The component can be, for example, a rotating shaft with a variable rotation speed (e.g., a speed that changes over time). The computing system can receive a set of data from the data acquisition system(s) of the aircraft. The set of data can be indicative of a signal associated with the rotating component and detected by the data acquisition system(s). In some implementations, the signal can include the frequency of the component as it rotates towards and/or away from the data acquisition system(s). The computing system can identify a plurality of phase reference points based, at least in part, on the set of data. Each of the phase reference points can indicate a phase position of the component relative to the data acquisition system at a respective point in time. The computing system can generate a model based, at least in part, on the phase reference points. The model can be used by the computing system to determine the instantaneous phase position of the component at any point in time within the measurement window of the data acquisition system(s). Accordingly, this can allow the computing system to properly perform analysis on a component that has a speed that is changing with time (e.g., via datasets acquired under unsteady conditions). Moreover, the computing system can perform an analysis (e.g., synchronous analysis) to determine the relative phase offset between the signal detected by the data acquisition system(s) (e.g., tachometer) and other time series data, as well as to determine the existence of a fault in the component.

More particularly, the data acquisition system(s) can monitor and collect a first set of data associated with a component. The component can be a mechanical component with a variable speed. For example, the component can be a rotating component that has a rotation speed that changes with time, such as a rotating shaft of an engine. The first set of data can be indicative of a signal associated with the component and that is detected by the data acquisition system(s). The signal can be associated with the vibration, phase position, etc. associated with the component. Moreover, the first set of data can be acquired as the speed of the component changes and/or under steady conditions. For example, in some implementations, the data acquisition system(s) can include a voltage sensor that measures the pulsations of voltage associated with the component. The voltage can be generated by an electric field that forms as the component rotates. As the component approaches the data acquisition system(s), current can flow one way, and as the component moves away from the data acquisition system(s), the current can switch directions to flow in the other way. The data acquisition system(s) can read the frequency at various times and include such information in the first set of data. The data acquisition system(s) can send the first set of data to the computing system.

The computing system can be configured to identify a plurality of pulses of the signal based, at least in part, on the first set of data. The pulses can be associated with the component as it passes the data acquisition system(s). Smaller pulses found in the signal can be associated with noise in the signal that can be created as a result of other elements (e.g., bolts) passing the data acquisition system(s). The computing system can calculate statistics for the pulses associated with the component. For example, the computing system can calculate a maximum, a minimum, and/or a mean associated with one or more of the pulse(s). The computing system can identify a threshold based, at least in part, on one or more of the pulse(s). In some implementations, the threshold can be associated with a percentage of one or more peaks (e.g., maximums) of one or more of the pulse(s).

The threshold can be used by the computing system to distinguish the pulses associated with the component from the noise. For example, the computing system can be configured to identify one or more of the plurality of pulse(s) that are above the threshold. The pulse(s) above the threshold can be, for example, those associated with the component, while the smaller pulses below the threshold can be associated with noise of the detected signal.

The computing system can identify a phase reference point for each of the pulses associated with the component (e.g., the pulses above the threshold). Each phase reference point can be indicative of a phase position of the component relative to the data acquisition system(s) at a respective point in time. For example, a phase reference point can be indicative of a point in time where the rotating shaft switches from moving towards the data acquisition system(s) (e.g., tachometer) to moving away from the data acquisition system(s). The phase reference point can be a reference point at which the data acquisition system(s) is highly confident of the phase position of the component.

In some implementations, the computing system can determine a phase reference point for each pulse (associated with the component) by identifying a local zero crossing for each pulse and performing an interpolation for each local zero crossing. For example, a pulse can be associated with stable regions located on either side of the pulse. The stable regions can be associated with one or more time period(s) during which the signal is not varying significantly in amplitude. This can arise, for example, from a lack of a significant part of the component passing the data acquisition system(s) during those time periods. The computing system can determine a local zero crossing for a pulse based, at least in part, on the stable regions. For example, the local zero crossing can be the point in time where the signal crosses the mean associated with the pulse, between the stable regions.

The computing system can identify a phase reference point for each pulse associated with the component based, at least in part, on an interpolation of two or more points associated with the local zero crossing. For example, the two or more points can include a first point associated with the local zero crossing and a second point associated with the local zero crossing. The first point can be indicative of a final reading of the data acquisition system(s) when the component (e.g., rotating shaft) is moving towards the data acquisition system(s). The second point can be indicative of an initial reading of the data acquisition system(s) when the component is moving away from the data acquisition system(s). The computing system can interpolate between the first point and the second point. The computing system can identify the phase reference point based, at least in part, on where the interpolation of the first and second points crosses the mean of the pulse. Such interpolation can be repeated for each of the pulses associated with the component to identify a plurality of phase reference points.

The computing system can generate a second set of data including the plurality of phase reference points. Moreover, the computing system can generate a model based, at least in part, on the plurality of phase reference points. In some implementations, the model can be based, at least in part, on a curve fit to the second set of data. In this way, the model can be indicative of the phase position of the component relative to the data acquisition system(s) at any point in time within the measurement window (e.g., the time period in which the data acquisition system is monitoring and/or collecting data associated with the component).

The computing system can be configured to determine the phase position of the component at one or more points in time based, at least in part, on the model. By knowing the position of the component at any given time, the computing system can better determine the existence of a fault of the component. For instance, this would allow the computing system to perform a synchronous analysis to determine the existence of a fault of the rotating shaft. The fault can include, for example, a crack, blemish, defect, etc. that can arise from fatigue, spoiling, pining, shipping damage, manufacturing defect, growth over time, etc.

The systems and methods according to example aspects of the present disclosure more accurately determine the phase position of a component of a mechanical system, such as an aircraft, railway train, wind turbine, etc. More particularly, the systems and methods can generate a model that allows for the determination of the phase position of the component at any given time within a measurement window. As a result, the systems and methods can allow for more accurate analysis to be performed on data from variable speed components. In this way, the systems and methods according to example aspects of the present disclosure have a technical effect of producing earlier indications of an incipient failure and reducing false alert rates, which can lead to a reduction in unscheduled maintenance and improved availability of the systems.

FIG. 1 depicts an example system 100 according to example embodiments of the present disclosure. As shown, the system 100 can include an aircraft 110 having one or more engine(s) 112, a fuselage 114, a computing system 116, and one or more data acquisition system(s) 119. While the present disclosure is described with reference to the aircraft 110, this is merely to serve as an example and is not intended to be limiting. For example, the computing system 116, data acquisition system(s) 119, and/or any other components/devices described herein can be asscoaited with other types of mechanical systems (e.g., systems with moving mechanical components and/or variable speed machinery), such as automobiles, railway trains, wind turbines, etc. to determine the phase position of a component within such types of system without deviating from the scope of the present disclosure.

As shown in FIG. 1, the computing system 116 can include one or more computing device(s) 117 that can be associated with, for instance, an avionics system. The computing device(s) 117 can include various components for performing various operations and functions. For example, and as further described herein, the computing device(s) 117 can include one or more processor(s) and one or more memory device(s). The one or more memory device(s) can store instructions that when executed by the one or more processor(s) cause the one or more processor(s) to perform the operations and functions described herein. In some implementations, the one or more computing device(s) 117 can be included in the aircraft 110. The computing device(s) 117 can be coupled to a variety of systems (e.g., data acquisition system(s) 119) on the aircraft 110 over a network 118. The network 118 can include a data bus or combination of wired and/or wireless communication links.

In some implementations, the computing system 116 and/or one or more of the computing device(s) 117 can be remote from aircraft 110. For instance, the computing system 116 and/or one or more of the computing device(s) 117 can be associated with a remote computing system, which can be configured to communicate with aircraft 110 (and/or the systems associated therewith) via one or more communication network(s). In such implementations, the computing system 116 and/or one or more of the computing device(s) 117 can be associated with an airborne platform and/or a ground-based computing system.

The data acquisition system(s) 119 can be configured to monitor and collect data with respect to one or more components of the aircraft 110. The data acquisition system(s) 119 can include a tachometer, magnetic tachometer, optical tachometer, sensor, and/or any other suitable type of measurement device. In some implementations, the data acquisition system(s) 119 can be associated with a mechanical component, such as a rotating component with a variable rotation speed (e.g., a rotation speed that varies with time), a variable vibration, etc. By way of example, the data acquisition system(s) 119 can be associated with a component 122 of the engine(s) 112, a component of an auxiliary power unit, etc.

Figure 2:
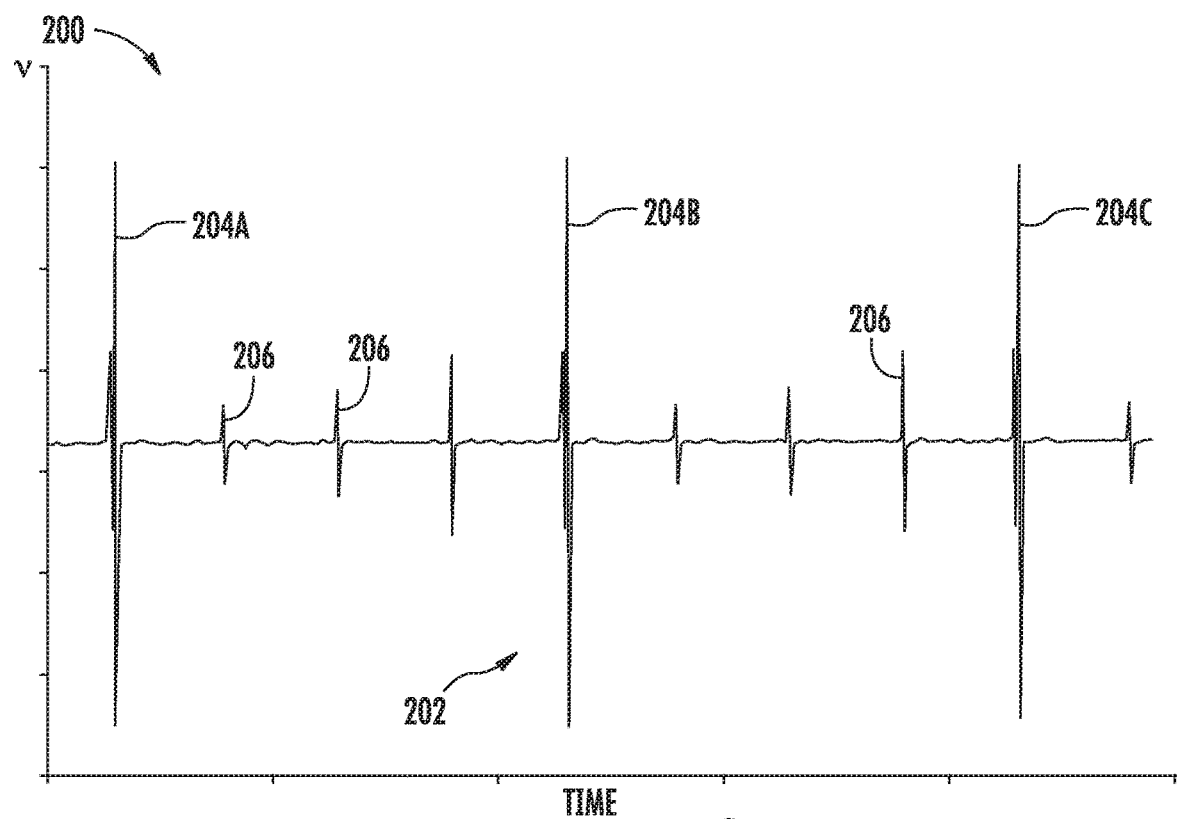
FIG. 2 depicts an example set of data according to examples of the present disclosure.

FIG. 2 depicts an example first set of data 200 associated with the component 122 according to example embodiments of the present disclosure. The first set of data 200 can be indicative of a signal 202 associated with the component 122, detected by the data acquisition system(s) 119. The signal 202 can be associated with the vibration, phase position, etc. associated with the component 122. For example, the data acquisition system(s) 119 (e.g., a magnetic tachometer) can include a voltage sensor that measures the pulsations of voltage associated with the component 122. The voltage can be generated by an electric field that forms as the component 122 moves. As the component 122 approaches the data acquisition system(s) 119, current flows one way and as the component 122 moves away from the data acquisition system(s) 119, the current switches direction. The data acquisition system(s) 119 can be configured to read the frequency with which the current changes direction at various times, as shown for example in FIG. 2. The data acquisition system(s) 119 can be configured to send the first set of data 200 to the computing device(s) 117. The computing device(s) 117 can be configured to receive the first set of data 200 from the data acquisition system(s) 119 associated with the component 122.

The computing device(s) 117 can be configured to identify a plurality of pulses 204A-C of the signal 202 based, at least in part, on the first set of data 200. The pulses 204A-C can be associated with the component 122 as it passes the data acquisition system(s) 119. The smaller pulses (e.g., 206) can be associated with noise in the signal 202 that is created as a result of other elements (e.g., bolts) passing the data acquisition system(s) 119.

Figure 3:
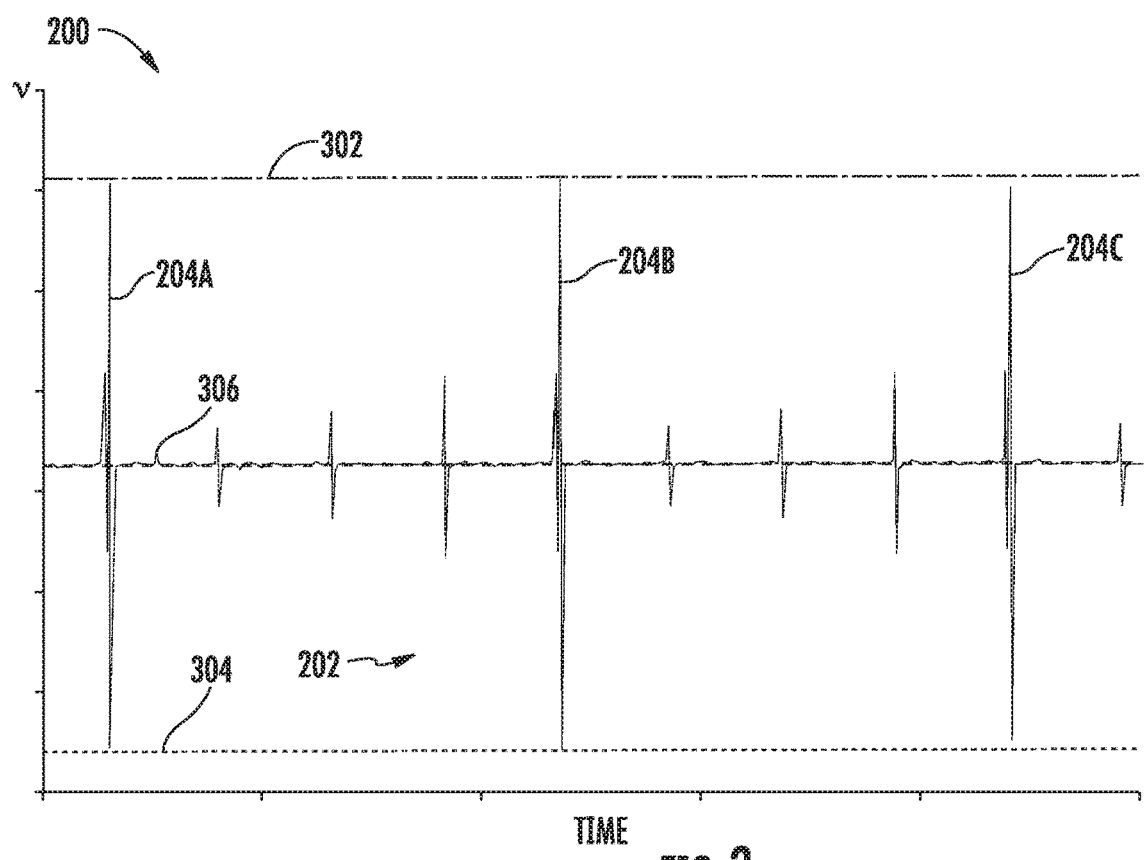
FIG. 3 depicts an example set of data according to examples of the present disclosure.

The computing device(s) 117 can be configured to calculate various statistics associated with one or more of the pulse(s) 204A-C. For example, as shown in FIG. 3, the computing devices can be configured to calculate a maximum 302, a minimum 304, and/or a mean 306 associated with one or more of the pulse(s) 204A-C. In some implementations, the maximum 302, the minimum 304, and/or the mean 306 can be calculated based, at least in part, on one of the pulse(s) 204A-C. In some implementations, these statistics can be calculated based, at least in part, on two or more of the pulses 204A-C.

Figure 4:
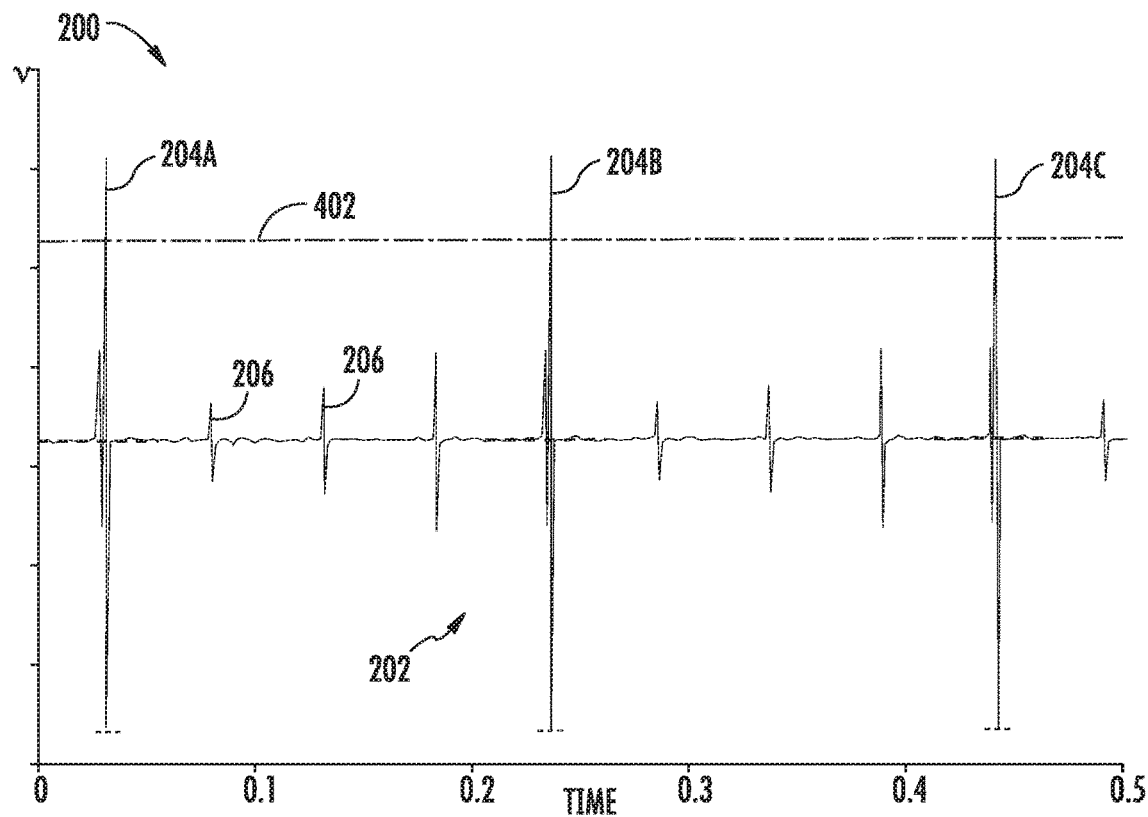
FIG. 4 depicts an example set of data according to examples of the present disclosure.

As shown in FIG. 4, the computing device(s) 117 can be configured to identify a threshold 402 based, at least in part, on one or more of the pulse(s) 204A-C. The threshold 402 can be, for example, associated with a percentage of one or more peaks (e.g., maximums 302) of one or more of the pulse(s) 204A-C. In some implementations, the threshold 402 can be associated with a percentage of a minimum 304.

The threshold 402 can be used by the computing device(s) 117 to distinguish the pulse(s) 204A-C associated with the component 122 from the noise (e.g., 206). For example, the computing device(s) 117 can be configured to identify one or more of the plurality of pulse(s) 204A-C that are above the threshold 402. The pulse(s) 204A-C that are above the threshold 402 can be, for example, those associated with the component 122. In some implementations, one or more of the smaller pulses (e.g., 206) below the threshold 402 can be associated with noise of the signal 202.

The computing device(s) 117 can be configured to identify a plurality of phase reference points based, at least in part, on the first set of data 200. Each phase reference point can be indicative of a phase position of the component 122 relative to the data acquisition system(s) 119 at a respective point in time. For example, the phase reference point can be indicative of the point in time where the component 122 switches from moving towards the data acquisition system(s) 119 to moving away from the data acquisition system(s) 119. The phase reference point can be a reference point at which the data acquisition system(s) 119 is highly confident of the phase position of the component 122.

Figure 5:
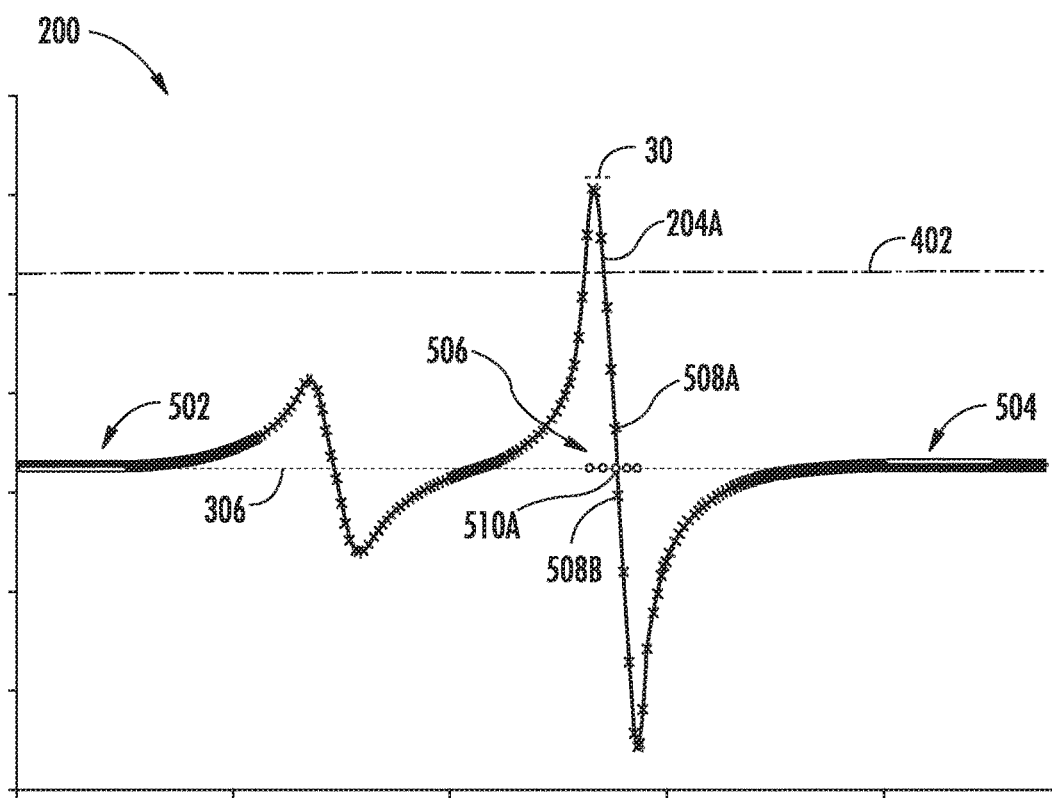
FIG. 5 depicts an example signal pulse according to examples of the present disclosure.

The computing device(s) 117 can be configured to determine a phase reference point for each pulse 204A-C based, at least in part, on a local zero crossing associated with the respective pulse. The computing device(s) 117 can be configured to determine a local zero crossing for each of the one or more pulse(s) 204A-C that are above the threshold 402 based, at least in part, on the first set of data 200. For example, FIG. 5 shows a zoomed view of the pulse 204A, the first of the pulses that is above threshold 402. The pulse 204A can be associated with stable regions 502 and 504 on either side of the pulse 204A. The stable regions 502 and 504 can be associated with one or more time periods where the signal 202 is not varying significantly in amplitude, for example, due to a lack of a significant part of the component 122 passing the data acquisition system(s) 119 during those time periods. The computing device(s) 117 can be configured to determine a local zero crossing 506 for pulse 204A. The local zero crossing 506 can be the point in time where the pulse 204A crosses the mean 306 between the stable regions 502 and 504.

The computing device(s) 117 can be configured to identify a phase reference point for each of the one or more pulse(s) 204A-C based, at least in part, on an interpolation of two or more points associated with the local zero crossing 506. For example, as shown in FIG. 5, the two or more points can include a first point 508A associated with the local zero crossing 506 and a second point 508B associated with the local zero crossing 506. The first point 508A can be indicative of a final reading of the data acquisition system(s) 119 when the component 122 is moving towards the data acquisition system(s) 119. The second point 508B can be indicative of an initial reading of the data acquisition system(s) 119 when the component is moving away from the data acquisition system(s) 119. The computing device(s) 117 can be configured to interpolate between the first point 508A and the second point 508B. The computing device(s) 117 can be configured to identify the phase reference point 510A associated with the pulse 204A based, at least in part, on where the interpolation of the first and second points 508A and 508B crosses the mean 306. The computing device(s) 117 can be configured to repeat these operations for each of the pulses 204B-C. In this way, the computing device(s) 117 can identify a phase reference point 510A-C for each of the one or more pulses 204A-C associated with the component 122 (e.g., of the engine 112) based, at least in part, on the first set of data 200.

Figure 6:
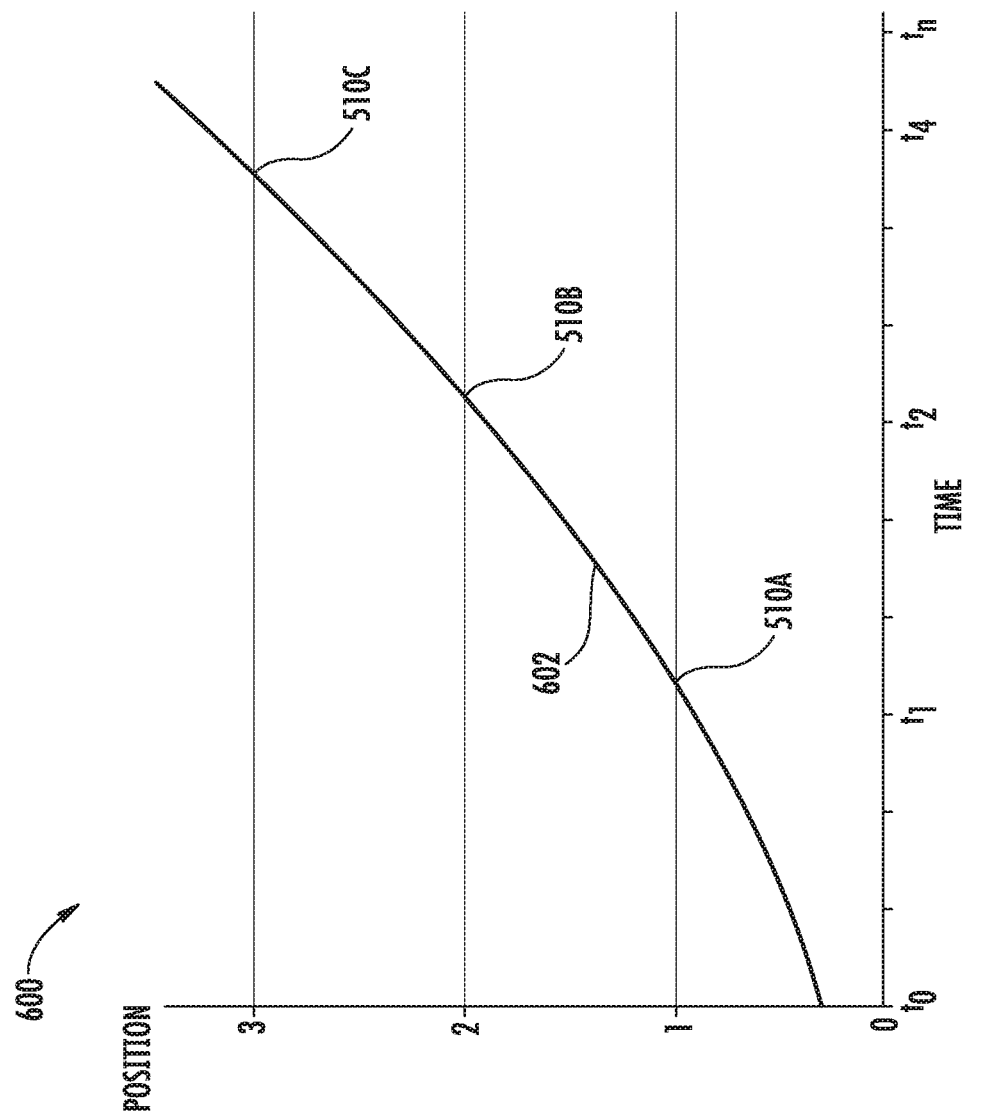
FIG. 6 depicts an example set of data according to examples of the present disclosure.

The computing device(s) 117 can be configured to generate a second set of data including the plurality of phase reference points 510A-C. For example, FIG. 6 depicts a second set of data 600 including each of the phase reference points 510A-C identified using the aforementioned operations. The computing device(s) 117 can be configured to generate a model 602 based, at least in part, on the plurality of phase reference points 510A-C. The model 602 can be, for instance, based, at least in part, on a curve fit to the second set of data 600 comprising the plurality of phase reference points 510A-C, as shown in FIG. 6. The model 602 can be indicative of the phase position of the component 122 relative to the data acquisition system(s) 119 at a plurality of times ($t_0 \ldots t_n$).

The computing device(s) 117 can be configured to determine the phase position of the component 122 at one or more points in time ($t_0 \ldots t_n$) based, at least in part, on the plurality of phase reference points 510A-C. For example, the computing device(s) 117 can be configured to determine the phase position of the component 122 at one or more points in time ($t_0 \ldots t_n$) based, at least in part, on the model 602. This can allow the computing device(s) 117 to determine the phase position of the component at any given time within a measurement window in which the data acquisition system(s) 119 are collecting data associated with the component 122. In some implementations, this can be the time range ($t_0 \ldots t_n$) shown in the figures. Accordingly, the computing device(s) 117 can better determine the existence of a fault of the component 122. For instance, this would allow the computing device(s) 117 to perform a synchronous analysis based, at least in part, on the phase position of the component 122 at the one or more points in time to determine the existence of a fault 150 (e.g., as shown in FIG. 1) of the component 122. The fault 150 can include, for example, a crack, blemish, defect, etc. that can arise from fatigue, spoiling, pitting, shipping damage, manufacturing defect, growth over time, etc.

The computing device(s) 117 can be configured to perform a maintenance event. For instance, the computing device(s) 117 can be configured to perform a maintenance event associated with the component 122 when the existence of the fault 150 is determined. For example, returning to FIG. 1, when the computing device(s) 117 determine that a fault 150 (e.g., a crack due to fatigue) exists in the component 122 (e.g., a rotating shaft) the computing device(s) 117 can be configured to perform a maintenance event 120, such as sending a message via the network 130 to a remote computing system 140. The message can described the fault 150, request maintenance of the component 122, etc. The remote computing system 140 can be associated with an entity that would perform such maintenance of the component 122. In this way, the computing device(s) 117 can ultimately address a fault 150 associated with the component 122 based, at least in part, on the first set of data 200, the phase reference points 510A-C, the model 602, etc.

Figure 7:
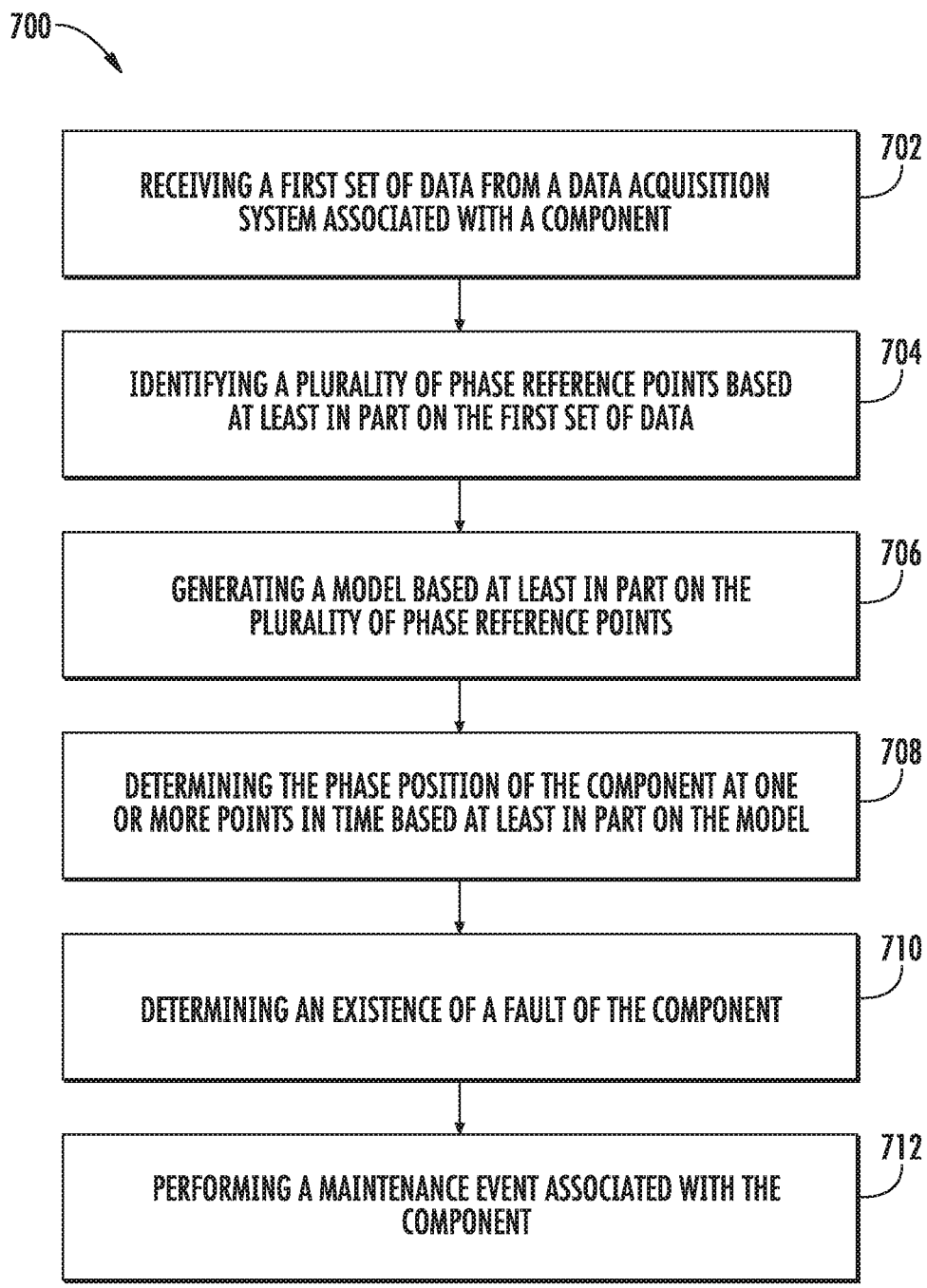
FIG. 7 depicts a flow diagram of an example method for determining aircraft component phase position in a mechanical system according to examples of the present disclosure.

FIG. 7 depicts a flow diagram of example method 700 for determining component phase position in a mechanical system according to example embodiments of the present disclosure. FIG. 7 can be implemented by one or more computing device(s), such as the computing device(s) 117 depicted in FIGS. 1 and 8. One or more step(s) of the method 700 can be performed while aircraft 110 is in-flight. In addition, FIG. 7 depicts steps performed in a particular order for purposes of illustration and discussion. Those of ordinary skill in the art, using the disclosures provided herein, will understand that the various steps of any of the methods disclosed herein can be modified, adapted, expanded, rearranged and/or omitted in various ways without deviating from the scope of the present disclosure.

At (702), the method 700 can include receiving a first set of data from a data acquisition system associated with a component of a mechanical system. For instance, computing device(s) 117 can receive a first set of data 200 from the data acquisition system(s) 119 associated with the component 122 of the aircraft 110. As described herein, the first set of data 200 can be indicative of a signal 202 associated with the component 122 and detected by the data acquisition system(s) 119. For example, the first set of data 200 can be a signal 202 detected by a magnetic tachometer associated with a rotating component, wherein a rotation speed of the component varies with time. The signal 202 can be indicative of a frequency relative to time.

At (704), the method 700 can include identifying a plurality of phase reference points based, at least in part, on the first set of data. For instance, the computing device(s) 117 can identify a plurality of phase reference points 510A-C based, at least in part, on the first set of data 200. Each phase reference point 510A-C can be indicative of a phase position of the component 122 relative to the data acquisition system(s) 119 at a respective point in time.

For example, the computing device(s) 117 can identify a plurality of pulses 204A-C of the signal 202 based, at least in part, on the first set of data 200. Using a threshold 402, the computing device(s) 117 can filter the desired pulses from noise. In some implementations, the computing device(s) 119 can determine the threshold 402 based, at least in part, on the pulse(s) 204A-C, such that the threshold 402 can be associated with a percentage of one or more peak(s) (e.g., maximum 302) of the pulse(s) 204A-C. The computing device(s) 117 can identify one or more of the plurality of pulse(s) 204A-C that are above the threshold 402. The one or more pulses 204A-C above the threshold 402 can be indicative of the pulse(s) 204A-C associated with the component 122 and the one or more pulse(s) 206 below the threshold can be indicative of noise associated with the signal 202. By way of example, the pulse(s) 204A-C above the threshold 402 can be associated with a rotating shaft as it passes the data acquisition system(s) 119 (e.g., tachometer), while the pulse(s) 206 below the threshold can be associated with other elements (e.g., bolts).

The computing device(s) 117 can determine a local zero crossing for each of the one or more pulse(s) 204A-C that are above the threshold 402 based, at least in part, on the first set of data 200. For instance, the computing device(s) 117 can identify (for each of the one or more pulse(s) 204A-C above the threshold 402) a first point (e.g., 508A) associated with the local zero crossing (e.g., 506) and a second point (e.g., 508B) associated with the local zero crossing. The first point (e.g., 508A) can be indicative of a final data point recorded when the component 122 is moving towards the data acquisition system 119. The second point (e.g., 508B) can be indicative of an initial data point recorded when the component 122 is moving away from the data acquisition system 119. Accordingly, as described above, the computing device(s) 117 can identify the phase reference point 510A-C for each of the one or more pulse(s) 204A-C (above the threshold 402) based, at least in part, on an interpolation of the respective first and second points for the local crossing associated with the respective pulse.

At (706), the method 700 can include generating a model based, at least in part, on the plurality of phase reference points 510A-C. For instance, the computing device(s) 117 can generate a model 602 based, at least in part, on the plurality of phase reference points 510A-C. To do so, in some implementations, the computing device(s) 117 can generate a second set of data 600 including the plurality of phase reference points 510A-C. The computing device(s) 117 can generate the model 602 based, at least in part, on a curve fit to the second set of data 600. Accordingly, the model 602 can be indicative of the phase position of the component 122 relative to the data acquisition system 119 at a plurality of times ($t_0 \ldots t_n$). Moreover, the model 602 can be indicative of the phase position of the component 122 at times that would not generally be provided by the first set of data 200 and/or the data acquisition system 119. Particularly, the model 602 can allow computing device(s) 117 to determine the phase position of the component 122 (e.g., with a variable rotation speed) at any given time, in a measurement window.

At (708), the method 700 can include determining the phase position of the component at one or more points in time based, at least in part, on the model. For instance, the computing device(s) 117 can determine the phase position of the component 122 at one or more points in time (e.g., $t_0 \ldots t_n$) based, at least in part, on the model 602. By way of example, the model 602 can be indicative of the phase position of a rotating component of engine 112 at a plurality of times. The computing device(s) 117 can select any time in the measurement window (e.g., $t_0 \ldots t_n$) and use the model 602 to determine the phase position of the rotating component at that time. Accordingly, the computing device(s) 117 can determine the relative phase offset between the signal 202 captured by the data acquisition system(s) 119 (e.g., a tachometer) and other time series data that varies as a function of phase.

At (710), the method 700 can include determining an existence of a fault of the component. For instance, the computing device(s) 117 can determine an existence of a fault 150 of the component 122 based, at least in part, on the phase position of the component 122 at the one or more points in time (e.g., $t_0 \ldots t_n$). In some implementations, the computing device(s) 117 can perform a synchronous analysis based, at least in part, on the phase position of the component 122 at the one or more points in time (e.g., $t_0 \ldots t_n$) to determine the existence of the fault 150 of the component 122. This can be based, at least in part, on an analysis of the position of the component 122 relative to the data acquisition system(s) 119 and/or a change in that position over time.

At (712), the method 700 can include performing a maintenance event associated with the component. For instance, the computing device(s) 117 can perform a maintenance event 120 associated with the component 122 when the existence of the fault 150 is determined. By way of example, when the computing device(s) 117 determine that the fault 150 (e.g., a crack due to fatigue) exists in the component 122 (e.g., a rotating shaft) the computing device(s) 117 can perform a maintenance event 120, such as sending a message via the network 130 to a remote computing system 140. The message can describe the fault 150, request maintenance of the component 122, etc. The remote computing system 140 can be associated with an entity that would perform such maintenance of the component 122. In this way, the computing device(s) 117 can ultimately address a fault 150 associated with the component 122 based, at least in part, on the first set of data 200, the phase reference points 510A-C, the model 602, etc.

Figure 8:
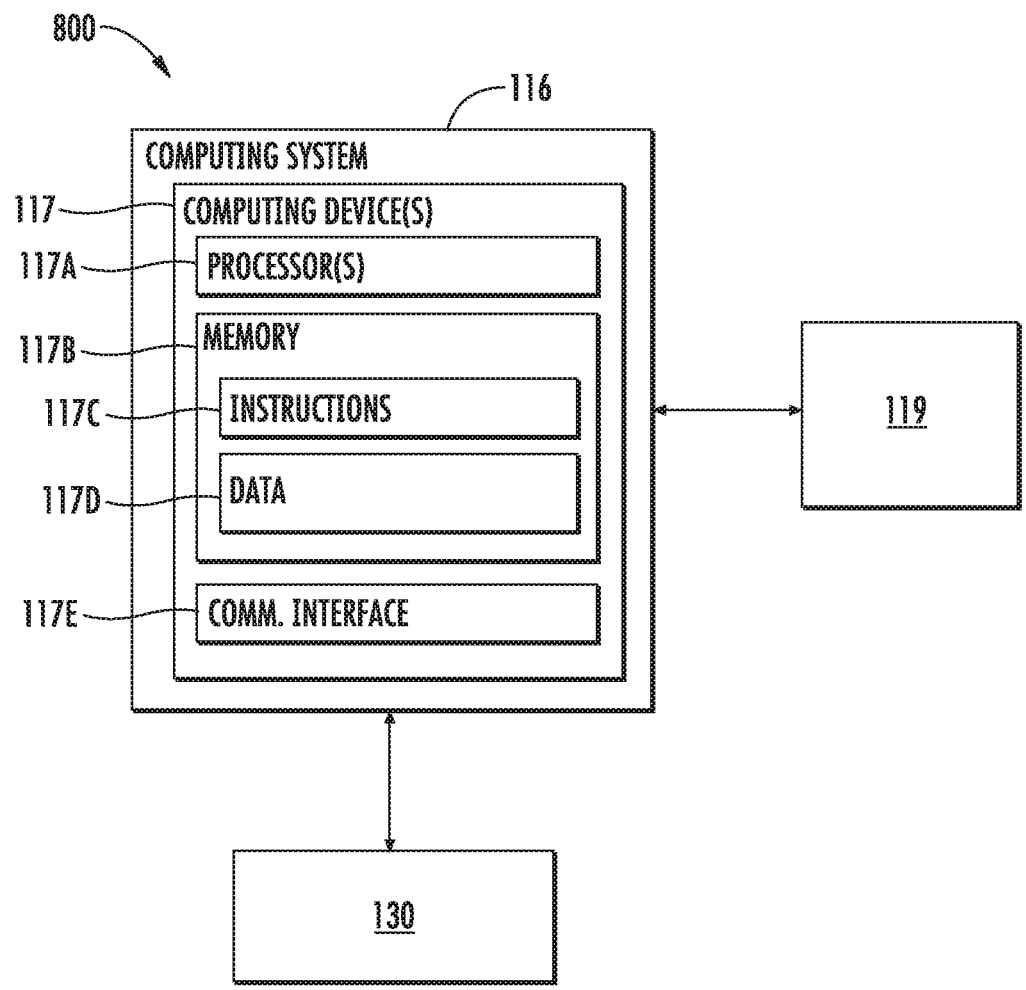
FIG. 8 depicts an example system according to examples of the present disclosure.

FIG. 8 depicts an example system 800 according to example embodiments of the present disclosure. The system 800 can include the computing system 116 and the data acquisition system(s) 119, which can be configured to communicate via network 118 (not shown). In some implementations, the system can include the remote computing system 140. The remote computing system 140 can be located at a remote location that is separated and remote from the computing system 116. For instance, the remote computing system 140 can be associated with a ground-based system of a maintenance entity. The computing system 116 and the remote computing system 140 can be configured to communicate via the communications networks 130 (not shown).

The computing system 116 can include one or more computing device(s) 117. The computing device(s) 117 can include one or more processor(s) 117A and one or more memory device(s) 117B. The one or more processor(s) 117A can include any suitable processing device, such as a microprocessor, microcontroller, integrated circuit, logic device, and/or other suitable processing device. The one or more memory device(s) 117B can include one or more computer-readable media, including, but not limited to, non-transitory computer-readable media, RAM, ROM, hard drives, flash drives, and/or other memory devices.

The one or more memory device(s) 117B can store information accessible by the one or more processor(s) 117A, including computer-readable instructions 117C that can be executed by the one or more processor(s) 117A. The instructions 117C can be any set of instructions that when executed by the one or more processor(s) 117A, cause the one or more processor(s) 117A to perform operations. In some embodiments, the instructions 117C can be executed by the one or more processor(s) 117A to cause the one or more processor(s) 117A to perform operations, such as any of the operations and functions for which the computing system 116 and/or the computing device(s) 117 are configured, the operations for determining component phase position (e.g., method 700), as described herein, and/or any other operations or functions of the one or more computing device(s) 117. The instructions 117C can be software written in any suitable programming language or can be implemented in hardware. Additionally, and/or alternatively, the instructions 117C can be executed in logically and/or virtually separate threads on processor(s) 117A. The memory device(s) 117B can further store data 117D that can be accessed by the processors 117A. For example, the data 117D can include the first set of data 200, the second set of data 600, the model 602, the phase reference points, and/or any other data and/or information described herein.

The computing device(s) 117 can also include a network interface 117E used to communicate, for example, with the other components of system 800 (e.g., via network 118, network 130). The network interface 117E can include any suitable components for interfacing with one or more network(s), including for example, transmitters, receivers, ports, controllers, antennas, and/or other suitable components.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the present disclosure, including the best mode, and also to enable any person skilled in the art to practice the present disclosure, including making and using any devices or systems and performing any incorporated methods. The patentable scope of the present disclosure is defined by the claims, and can include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A computer-implemented method of determining phase position of a component in a mechanical system relative to a data acquisition system, comprising:

receiving, by one or more computing devices, a first set of data from the data acquisition system associated with the component, wherein the first set of data is indicative of a signal detected by the data acquisition system;

identifying, by the one or more computing devices, a plurality of phase reference points based at least in part on the first set of data, wherein each phase reference point is indicative of the position of the component relative to the data acquisition system at a respective point in time;

generating, by the one or more computing devices, a model based at least in part on the plurality of phase reference points, wherein the model is indicative of the phase position of the component relative to the data acquisition system at a plurality of times; and determining, by the one or more computing devices, the phase position of the component at one or more points in time based at least in part on the model, wherein identifying, by the one or more computing devices, the plurality of phase reference points based at least in part on the first set of data comprises:
- identifying, by the one or more computing devices, a plurality of pulses of the signal based at least in part on the first set of data;
- determining, by the one or more computing devices, a threshold based at least in part on the pulses, wherein the threshold is associated with a percentage of one or more peaks of the pulses;
- identifying, by the one or more computing devices, one or more of the plurality of pulses that are above the threshold;
- determining, by the one or more computing devices, a local zero crossing for each of the one or more pulses that are above the threshold based at least in part on the first set of data;
- identifying, by the one or more computing devices, for each of the one or more pulses above the threshold, a first point associated with the local zero crossing and a second point associated with the local zero crossing, wherein the first point is indicative of a final data point recorded when the component is moving towards the data acquisition system, and wherein the second point is indicative of an initial data point recorded when the component is moving away from the data acquisition system; and
- identifying, by the one or more computing devices, the phase reference point for each of the one or more pulses based at least in part on an interpolation of the respective first and second points.

2. The computer-implemented method of claim 1, wherein the component is a rotating component, and wherein a rotation speed of the component varies with time.

3. The computer-implemented method of claim 1, further comprising:
- determining, by the one or more computing devices, an existence of a fault of the component based at least in part on the phase position of the component at the one or more points in time.

4. The computer-implemented method of claim 3, wherein determining, by the one or more computing devices, the existence of the fault of the component based at least in part on the phase position of the component at the one or more points in time comprises:
- performing, by the one or more computing devices, a synchronous analysis based, at least, in part, on the phase position of the component at the one or more points in time to determine the existence of the fault of the component.

5. The computer-implemented method of claim 3 further comprising:
- performing, by the one or more computing devices, a maintenance event associated with the component when the existence of the fault is determined.

6. The computer-implemented method of claim 1, wherein generating, by the one or more computing devices, the model based at least in part on the plurality of phase reference points comprises:
- generating, by the one or more computing devices, a second set of data comprising the plurality of phase reference points; and
- generating, by the one or more computing devices, the model based at least in part on a curve fit to the second set of data.

7. The computer-implemented method of claim 1, wherein the one or more pulses above the threshold are indicative of the pulses associated with the component and wherein one or more pulses below the threshold are indicative of noise associated with the signal.

8. A computing system for determining component phase position, the system comprising one or more processors and one or more memory devices, the one or more memory devices storing instructions that when executed by the one or more processors cause the one or more processors to perform operations, the operations comprising:
- receiving a first set of data from a data acquisition system associated with a component, wherein the first set of data is indicative of a signal detected by the data acquisition system;
- identifying a plurality of phase reference points based at least in part on the first set of data, wherein each phase reference point is indicative of a phase position of the component relative to the data acquisition system at a respective point in time;
- determining the phase position of the component at one or more points in time based at least in part on the plurality of phase reference points,
wherein identifying the plurality of phase reference points based at least in part on the first set of data comprises:
- identifying a plurality of pulses of the signal based at least in part on the first set of data;
- determining a threshold based at least in part on the pulses, wherein the threshold is associated with a percentage of one or more peaks of the pulses;
- identifying one or more of the plurality of pulses that are above the threshold;
- determining a local zero crossing for each of the one or more pulses that are above the threshold based at least in part on the first set of data;
- identifying for each of the one or more pulses above the threshold, a first point associated with the local zero crossing and a second point associated with the local zero crossing, wherein the first point is indicative of a final data point recorded when the component is moving towards the data acquisition system, and wherein the second point is indicative of an initial data point recorded when the component is moving away from the data acquisition system; and
- identifying the phase reference point for each of the one or more pulses based at least in part on an interpolation of the respective first and second points.

9. The computing system of claim 8, wherein the operations further comprise:
- determining an existence of a fault of the component based at least in part on the phase position of the component at the one or more points in time.

10. The computing system of claim 9, wherein determining the existence of the fault of the component based at least in part on the phase position of the component at the one or more points in time comprises:
- performing, by the one or more computing devices, a synchronous analysis based on the phase position of the component at the one or more points in time.

11. The computing system of claim 8, wherein determining the phase position of the component at one or more points in time based at least in part on the plurality of phase reference points comprises:
- generating a model based at least in part on the plurality of phase reference points, wherein the model is indicative of the phase position of the component relative to the data acquisition system at a plurality of times; and
- determining the phase position of the component at one or more points in time based at least in part on the model.

12. The computing system of claim 11, wherein the model is based at least in part on a curve fit to a second set of data comprising the plurality of phase reference points.

13. An aircraft comprising:
a component with a variable rotation speed;
a data acquisition system associated with the component;
a computing system with one or more processors and one or more memory devices, the one or more memory devices storing instructions that when executed by the one or more processors cause the one or more processors to perform operations, the operations comprising:
receiving a first set of data from the data acquisition system, wherein the first set of data is indicative of a signal associated with the component detected by the data acquisition system;
identifying a plurality of pulses of the signal based on the first set of data;
determining a threshold based at least in part on the pulses;
identifying one or more of the plurality of pulses that are above the threshold, wherein the pulses that are above the threshold are associated with the component;
identifying a phase reference point for each of the one or more pulses associated with the component based at least in part on the first set of data, wherein each phase reference point is indicative of a phase position of the component relative to the data acquisition system at a respective point in time; and
determining the phase position of the component at one or more points in time based at least in part on the plurality of phase reference points,
wherein identifying the phase reference point for each of the one or more pulses associated with the component based at least in part on the first set of data comprises:
identifying, by the one or more computing devices, a plurality of pulses of the signal based at least in part on the first set of data;
determining, by the one or more computing devices, the threshold based at least in part on the pulses, wherein the threshold is associated with a percentage of one or more peaks of the pulses;
identifying, by the one or more computing devices, one or more of the plurality of pulses that are above the threshold;
determining, by the one or more computing devices, a local zero crossing for each of the one or more pulses that are above the threshold based at least in part on the first set of data;
identifying, by the one or more computing devices, for each of the one or more pulses above the threshold, a first point associated with the local zero crossing and a second point associated with the local zero crossing, wherein the first point is indicative of a final data point recorded when the component is moving towards the data acquisition system, and wherein the second point is indicative of an initial data point recorded when the component is moving away from the data acquisition system; and
identifying, by the one or more computing devices, the phase reference point for each of the one or more pulses based at least in part on an interpolation of the respective first and second points.

14. The aircraft of claim 13, wherein the operations further comprise:
performing a synchronous analysis based on the phase position of the component at the one or more points in time to determine the existence of a fault of the component.

15. The aircraft of either of claim 13, wherein determining the phase position of the component at one or more points in time based at least in part on the plurality of phase reference points comprises:
generating a model based at least in part on the plurality of phase reference points, wherein the model is indicative of the phase position of the component relative to the data acquisition system at a plurality of times; and
determining the phase position of the component at one or more points in time based at least in part on the model.

* * * * *